(12) United States Patent
Sichert et al.

(10) Patent No.: US 7,573,760 B2
(45) Date of Patent: Aug. 11, 2009

(54) INTEGRATED CIRCUIT FOR SAMPLING A SEQUENCE OF DATA PACKETS AT A DATA OUTPUT

(75) Inventors: Christian Sichert, Munich (DE); Rainer Bartenschlager, Kaufbeuren (DE); Franz Freimuth, Munich (DE); Jens Polney, Munich (DE)

(73) Assignee: Qimonda AG, Munich (DE)

( * ) Notice: Subject to any disclaimer, the term of this patent is extended or adjusted under 35 U.S.C. 154(b) by 145 days.

(21) Appl. No.: 11/854,463

(22) Filed: Sep. 12, 2007

(65) Prior Publication Data

US 2008/0061852 A1 Mar. 13, 2008

(30) Foreign Application Priority Data

Sep. 13, 2006 (DE) .................... 10 2006 042 858

(51) Int. Cl.
*G11C 7/00* (2006.01)
(52) U.S. Cl. ............. 365/198; 365/230.01; 365/189.17; 365/193; 365/230.03; 365/230.04
(58) Field of Classification Search .............. 365/198, 365/230.01, 230.03, 230.04, 189.17, 193
See application file for complete search history.

(56) References Cited

U.S. PATENT DOCUMENTS

| 6,259,627 B1 * | 7/2001 | Wong ..................... 365/185.21 |
| 6,522,596 B2 * | 2/2003 | Gillingham et al. ......... 365/227 |
| 2004/0057331 A1 | 3/2004 | Graaff |
| 2004/0222828 A1 | 11/2004 | Ishikawa |

* cited by examiner

*Primary Examiner*—Pho M. Luu
*Assistant Examiner*—Tha-o Bui
(74) *Attorney, Agent, or Firm*—Patterson & Sheridan, L.L.P.

(57) ABSTRACT

An integrated circuit comprises a sampling circuit arranged at a data output of an operating section and operated by sampling edges, data packets appearing at the data output in response to a sequence of request commands, and a control section configured to produce the sampling edges, the control section comprising at least two transmission branches each comprising a copy of the operating section. Pulse trains are applied to the transmission branches which have the same waveform as the sequence of request commands and are delayed relative to one another, wherein the first pulse train is contemporaneous with the sequence of request commands. The sampling edges are produced from leading edges of the pulse trains which appear at the outputs of the transmission branches.

24 Claims, 8 Drawing Sheets

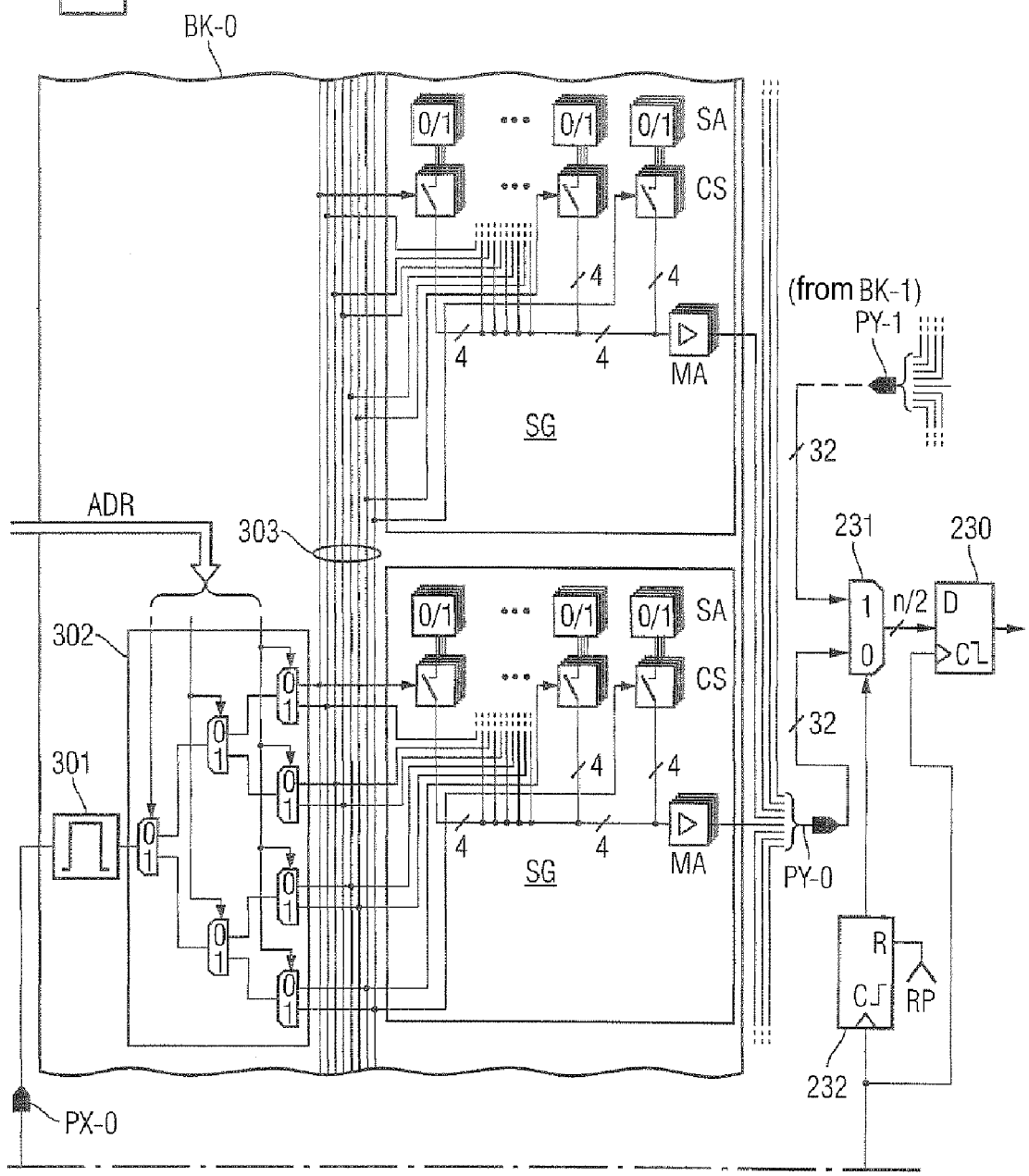

INTEGRATED CIRCUIT FOR SAMPLING A SEQUENCE OF DATA PACKETS AT A DATA OUTPUT

CROSS-REFERENCE TO RELATED APPLICATIONS

This application claims foreign priority benefits under 35 U.S.C. §119 to co-pending German patent application number DE 10 2006 042 858.7-55, filed 13 Sep. 2006. This related patent application is herein incorporated by reference in its entirety.

BACKGROUND OF THE INVENTION

1. Field of the Invention

The invention relates to an integrated circuit for sampling a sequence of data packets at a data output, wherein each data packet appears in response to a request command. An important, but not exclusive, area of application is sampling the data read from memory cells in a memory.

2. Description of the Related Art

In order to transmit a binary data item which is queuing in a data source from the data source to a data output and to sample it there for the purpose of using it or forwarding it in clocked fashion, a request command is usually sent by a command issuer to a switching device, which is then closed and connects the data source to a data path routed to said data output. If a request command is used to request a packet comprising a plurality of parallel data bits, the switching device connects a corresponding number of parallel data paths to a data output which has an appropriate number of connections.

A "command path" routed from the command issuer to the switching device may contain line sections of greater or lesser length and discrete circuits, such as pulse shapers and demultiplexer stages for addressing the respective data source which is to be addressed. Equally, each data path may contain line sections and discrete circuits, such as amplifiers.

The chain of all the elements which are involved in the request for a respective data bit, that is to say the chain comprising the command path, the switching device and the data path, can be referred to as an "operating section" for the data request. As a result of the delays or transfer times on the elements in the command path and the data path and also the response time of the switching device, a certain time period elapses from the time at which the request command is sent up to the appearance of the requested data item at the data output, said time period subsequently being referred to as the "latency" of the operating section. It is necessary to wait for this latency before the requested data item can be sampled at the data output for further use. The sampling itself is usually done by triggering a sampling circuit arranged at the data output by means of a defined edge of a sampling pulse which is received via a control section with timing related to that of the request command.

Frequently, it is also desirable, prior to each sampling operation, to stipulate a time for making certain preparations which decide upon the further handling of the respective data item which is to be sampled. By way of example, this may be the conditioning of a demultiplexer which cyclically distributes successive data items from the data output over various routes. It may also be the conditioning of a parallel/series converter which routes individual bits of a packet comprising a plurality of parallel bits which appears at the data output onto the same bus in succession. An appropriate area of application is data sampling in a DDR-DRAM. In general, the signal stipulating the preparation time cannot become operative before the start of the relevant data item at the data output.

A method for taking account of the latency is to ensure a fixed waiting time between the time at which the request command is sent and the time of the sampling edge, e.g. using a timer or delay device which is operative in the control section and whose transfer time is set to a fixed value. However, the latency is not always constant, but rather can vary on the basis of production parameters, voltage and temperature, so that a fixed waiting time is not optimum.

SUMMARY OF THE INVENTION

One embodiment provides an integrated circuit comprising a sampling circuit arranged at a data output of an operating section and operated by sampling edges, data packets appearing at the data output in response to a sequence of request commands, and a control section configured to produce the sampling edges, the control section comprising at least two transmission branches each comprising a copy of the operating section. Pulse trains are applied to the transmission branches which have the same waveform as the sequence of request commands and are delayed relative to one another, wherein the first pulse train is contemporaneous with the sequence of request commands. The sampling edges are produced from leading edges of the pulse trains which appear at the outputs of the transmission branches.

BRIEF DESCRIPTION OF THE DRAWINGS

The features of embodiments will become clear from the following description, taking in conjunction with the accompanying drawings. It is to be noted, however, that the accompanying drawings illustrate only typical embodiments and are, therefore, not to be considered limiting of the scope of the invention. It may admit other equally effective embodiments.

DETAILED DESCRIPTION OF THE PREFERRED EMBODIMENT

Figure 1:
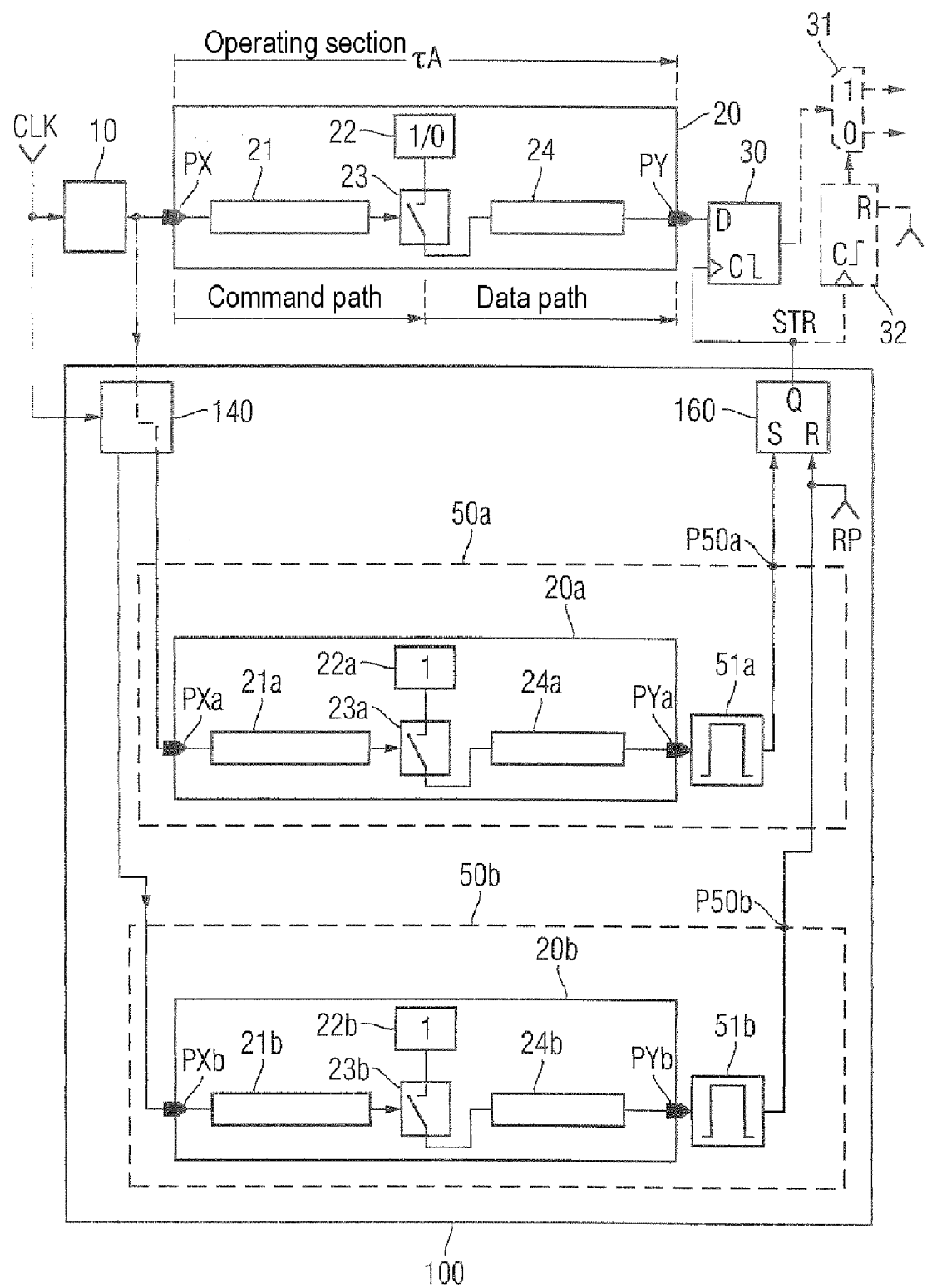
FIG. 1 illustrates the basic design of an embodiment of an integrated circuit having two copies of the operating section for the data request.

In the description below and in the drawings, the two possible values of a binary signal or data item are denoted by "0" and "1" in line with usual logic notation. Physically, these values are represented by two defined electrical potentials, one of which is referred to as the "high" potential with the usual abbreviation H and the other of which is referred to as the "low" potential with the abbreviation L . In the present case, the arbitrary convention that the H potential corresponds to the logic value "1" and the L potential corresponds to the logic value "0" will apply. In the timing diagrams shown in FIG. 2 and FIG. 4, the logic potentials are represented by high and low amplitude, and a transition from "low" to "high" is referred to as a "rising" edge while a transition in the opposite direction is referred to as a "falling" edge.

In the top part of FIG. 1, a small block symbolizes a data source 22 in which individual data bits, whose logic value may be "0" or "1", are provided successively upon retrieval. Each data bit provided is supposed to be transmitted by a request command via a data path 24 to a data output PY. To this end, the data source 22 has a transfer switch 23 on it which is closed by a request command in order to connect the data source 22 to the data path 24. The request command is sent by a command issuer 10 to a command input PX and is transmitted from there via a command path 21 to the control connection of the switch 23.

The arrangement comprising the command path 21, the data source 22, the transfer switch 23 and the data path, that is to say the chain of elements between the command input PX and the data output PY, forms what is known as the operating section for the data request. This operating section is bounded in the figure by a bold frame and is denoted by the reference 20. The signal transfer times via the command and data paths 21, 24 and the response time of the switch 23 in total produce the "latency" $\tau L$ for the data request, i.e. the total delay between the time of the request command at the command input PX and the start of the appearance of the requested data bit at the data output PY.

To be able to sample the data bits successively requested from the data source 22 at the data output PY of the operating section 20, this output is connected to the data input D of a sampling circuit 30 which can be operated by a defined edge of a strobe signal STR which is applied to the control input C of this circuit.

The command issuer 10 is controlled such that the request commands follow one another at a time interval $\tau A$. In the embodiment shown in FIG. 1, the time controller is effected on the basis of a clock signal CLK. The timing diagram in FIG. 2 shows the timing of signal states at various points of integrated circuit shown in FIG. 1 over a time axis which is scaled not to absolute time but rather to $\tau A$.

Figure 2:
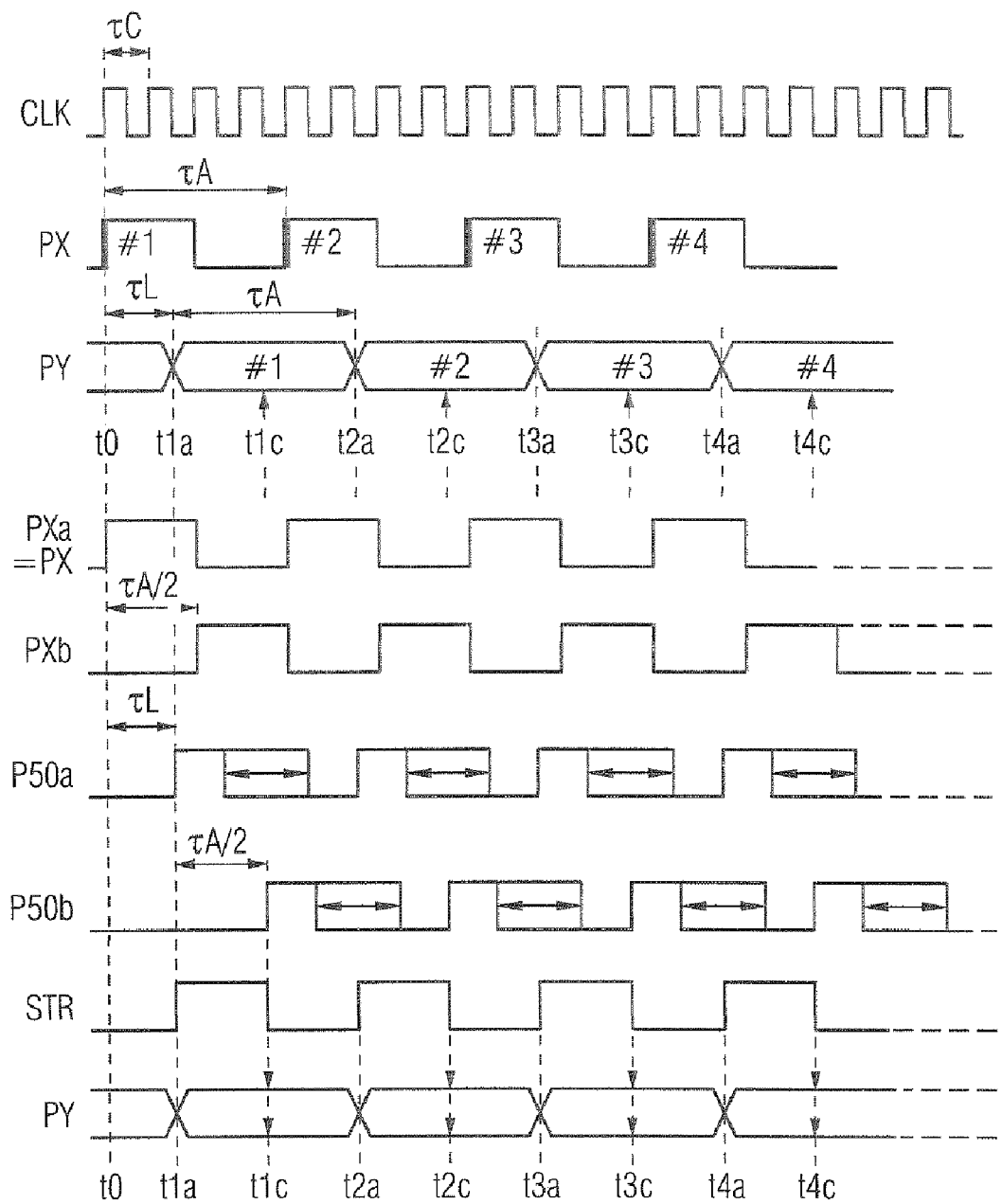
FIG. 2 shows a graphical illustration of the timing of signal states at various points of the integrated circuit shown in FIG. 1 over a common time axis.

The first line of the diagram shown in FIG. 2 shows the clock signal CLK in the form of a pulse train alternating between "0" and "1" with the duty cycle ½ and the period $\tau C$. The second line shows a sequence of request commands, appearing at the command input PX, which are sent by the command issuer 10 at regular time intervals $\tau A$. In the example shown, these time intervals respectively correspond to four periods of the clock signal CLK, that is to say that $\tau A = 4*\tau C$. In the case shown, the request commands are the leading edges, changing from "0" to "1", of a sequence of pulses and are in sync with the clock signal CLK such that they respectively start at a rising edge of the clock signal and last for two clock periods. This results in a duty cycle of exactly ½. Four successive request commands are shown, numbered from #1 to #4.

The third line in FIG. 2 illustrates the development of the data bits at the data output PY of the operating section 20. After the first request command #1 has been applied to the command input PX at a time t0, the first requested data bit #1 from the data source 22 arrives at the data output PY after the latency $\tau L$ has elapsed, that is to say at a time $t1a = t0 + \tau L$. To be more precise, the development of a binary state corresponding to the requested data bit begins at the data output PY at this time $t1a$. After a certain additional transient time, this binary state has been reached fully and is maintained there for as long as no new data bit arrives at this location. Only during this "validity period" is it possible to sample the requested data bit reliably.

When the next request command #2 is applied at a time $t0 + \tau A$ in order to request a new data bit from the data source 22, this new data bit arrives at the data output PY at a time $t2a = t1a + \tau A = t0 + \tau L + \tau A$. The new data bit at the data output can, again after the transient time has elapsed, be sampled at a suitable time during its validity period. In similar chronological order, respectively deferred by the interval $\tau A$, the binary states at the data output PY are developed when further data bits #3 and #4 are requested from the data source 22 by the subsequent request commands #3, #4, as shown in FIG. 2.

In FIG. 2, the boundaries between the appearance times of the requested data bits at the data output PY are respectively shown by signal edges, which illustrate the theoretically possible state transitions. Whether a state change actually takes place and in what direction it occurs are in actual fact naturally dependent on the binary values of the successive data bits. The longer the state changes respectively last (that is to say the "shallower" the edges) the shorter the validity period for the data bits at the data output PY. To be certain that the sampling comes within the validity period, the times for the sampling should be as far away from the bit boundaries as possible.

It is therefore to place the sampling times precisely in the center between the possible state changes, that is to say respectively delayed over the edges of the state changes by the time period $\tau A/2$. Accordingly, the sampling of each data bit should be respectively delayed over the request command for the relevant data bit by the time period $\tau L + \tau A/2$, as shown by the arrows in FIG. 2.

Within the frame 100, FIG. 1 shows the diagram for an inventive control section which takes the request commands sent by the command issuer 10 and derives a strobe signal STR containing edges both for controlling the sampling circuit 30 and for conditioning any switching means for preparing the sampling. This control section 100 contains two transmission branches 50a and 50b, each of which contains a copy 20a, b of the operating section 20 and a downstream pulse shaper 51a, b. In FIG. 1, the elements of the operating section copies 20a, b are respectively denoted by the same reference numerals as the elements of the original operating section 20, with a subsequent letter "a" or "b" indicating that the relevant elements belong to the copy 20a or 20b. Whereas the data source 22 in the original operating section 20 supplies a new data bit "0" or "1" for each request pulse, the data sources 22a, b in the copies 20a, b are of a nature such that they always supply a data bit having the same binary value, for example a "1", as shown in FIG. 1.

The inputs PXa, b of the two transmission branches 50a, b respectively receive an input pulse train which is supplied by an input circuit 140 in the control section 100. The pulse train applied to the input PXa of the first branch 50a corresponds to the sequence of request commands, both in terms of timing and in terms of waveform. This pulse train can thus be applied by means of direct non-delaying connection of the input PXa to the output of the command issuer, as indicated by dashes within the input circuit.

The pulse train applied to the input PXb of the second branch 50b likewise has the same waveform as the sequence of request commands, but is delayed by a time measure $\tau A/2$. This delay can be implemented in any suitable fashion using the clock signal CLK, which is supplied to the input circuit for this purpose, as shown in FIG. 1. Thus, the input circuit may contain a counter, for example, which is started upon each request command, sets a flipflop after counting two clock periods and resets the flipflop after counting a further two clock periods.

In the first branch 50a, in response to each request command, that is to say in response to each rising edge of the pulse train at the input PXa, the development of the binary value requested from the data source 22a starts at the output PYa of the operating section copy 20a, each time after the latency τL has elapsed. The downstream pulse shaper 51a is designed such that it inverts this binary value after a time period which is significantly shorter than τA. The output P50a of the branch 50a thus produces a sequence of "1" pulses, each of which starts after a time period τL after a request command. The leading edges of these pulses are thus coincident with the times t1a, t2a, t3a, t4a; they therefore mark the "starts" of the data bits appearing at the data output PY. Hence, these leading edges can be used as preparation signals for the subsequent sampling if desired.

The operating section copy 20b and the pulse shaper 51b in the second branch 50b of the control section 100 act in the same way as the elements 20a and 51a in the first branch 50a. Hence, the output P50b of the second branch 50b produces the same pulse train as the output P50a of the first branch 50a, but with the additional delay τA/2 as a result of the corresponding delay in the input pulse train. This means that the leading edges of the output pulses of the output P50b of the second branch 50b are coincident with the times t1c, t2c, t3c, t4c and therefore respective mark the "centres" of the validity periods for the data bits appearing at the data output PY. Hence, these leading edges can be used for sampling the data bits.

Since the times for preparation and sampling are defined only by the leading edges of the output pulses from the transmission branches 50a, b, the length of these pulses is uncritical. It is therefore not necessary to scale this length using τA. The only condition is that the pulse length is in each case shorter than τA. This means that the pulse shaper 51a, b can merely be a respective simple monoflop with a fixed reset time which is shorter than the smallest value of τA which is obtained at the fastest permissible repetition rate for the data request. If τA changes (e.g. as a result of a change in the clock frequency) then the duty cycle of the output pulse naturally changes, as indicated by the arrows on the waveforms P50a, b in FIG. 2.

Logic combination of the two pulses trains which appear at the outputs P50a, b of the two branches 50a, b makes it possible to produce a combined strobe signal STR with the appropriate edges for marking both the starts and the sampling times for the data bit at the output PY of the original operating section 20. To this end, the control section 100 contains an output circuit 160 which receives the two pulse trains and logically combines them such that every time the leading edge of a pulse appears a state change occurs at the output of the output circuit 160. In the strobe signal STR produced in this manner, the edges with an uneven ordinal number (that is to say first, third, etc.), which are all in the same direction, mark the starts of the data bits. The edges with an even ordinal number (that is to say the second, fourth, etc. edges), which are all in the opposite direction, mark the centres of the data bits. In the case shown, the sampling circuit 30 at the data output PY of the original operating section 20 is designed such that it is operated only by the falling edges of the strobe signal. The rising edges can be used for preparatory switching operations for each sampling operation.

As FIG. 1 shows, the output circuit 160 may contain an RS flipflop whose R and S inputs can be triggered only by rising edges, with the S input receiving the pulses from the output P50a of the first branch 50a, and the R input receiving the pulses from the output P50b of the second branch. Before the start of operation, the RS flipflop is put into its reset state by an initialization pulse RP applied to the R input.

Instead of the output circuit 160, it is also possible to provide a direct connection from the output P50b to the control input C of a sampling circuit which can be operated only by rising edges. For any preparatory switching operations which are desired, the rising edges from the other output P50a can be used.

FIG. 1 shows a very simplified form of the originating section 20 and its copies 20a, b in order to clearly explain the principle. The original data source 22 shown as a simple block is in practice designed such that it provides a new data bit prior to each new request. By way of example, the data source 22 may be the last stage of a shift register which is loaded with a sequence of data bits which are to be requested and is clocked prior to each new request command. The data source 22 may also contain a multiplicity of individual cells with a respective associated transfer switch, each of which has available one of the data bits from a sequence which is to be requested. In this case, each of these cells has an associated dedicated transfer switch, and the command path contains a selection device which is set by a selection signal prior to each request command such that the relevant request command closes a selected instance of these switches in order to transmit the data bit from the associated cell via the data path to the data output.

In addition, it has been assumed for the explanations above, by way of simplification, that the sequence of request data items is a sequence of individual bits. Often, however, it is desirable to request and sample a sequence of data packets which each comprise a plurality n of parallel bits, with the entire packet of n elements from a multibit data source respectively being available. In such cases, it can naturally likewise be applied. The data path then comprises n parallel individual paths which are connected to n parallel connections of an n-bit data output upon request via n parallel transfer switches. The command path need only be present once, but its end needs to branch to the various transfer switches via a selection device.

The copies of the operating section which are used in the control section need to contain, as a data source, just one cell for a single bit and in each case, even in the case of requests for n-bit packets, the model of just one of the n parallel data paths which are present in the original. In one embodiment, the pattern selected for each copy is that chain of circuit components in the original operating section whose latency corresponds roughly to the average of the latencies of all the data paths.

If the data which appear at the data output in succession are to be routed cyclically to various paths in a sequence of appearance, this can be done using the rising edges of the strobe signal for switching purposes. As shown in dashes in FIG. 1, the output of the sampling circuit 30 may have a suitable demultiplexer 31 arranged downstream of it, for example, which is changed over cyclically by the rising edges of the strobe signal STR shown in FIG. 2 by means of a control circuit 32. In the cases shown, one-to-two demultiplexing has taken place, with the control circuit 32 being designed such that it changes its output level upon every rising edge of the strobe signal. Before the start of operation, the control circuit is set to a preselected binary level, e.g. to "0", by an initialization pulse RP. In the case of demultiplexing, it is sufficient to sample the entire data output for each packet only once, specifically with the falling edges of the strobe signals STR shown in FIG. 2.

It may also be desirable to perform a plurality of successive sampling operations on every data packet which appears at the data output. This is the case when an n-bit data packet in parallel format comprises k disjunct groups of n/k respective parallel bits and these groups are supposed to be put onto an n/k-bit bus in succession. This requires a parallel/series converter, that is to say a k-to-1 multiplexer. Hence, a strobe signal is required which, within each data bit period, supplies k successive sampling edges which are respectively preceded by an edge for conditioning the multiplexer.

Figure 3:
FIG. 3 illustrates an embodiment having four copies of the operating section.
Figure 3A:
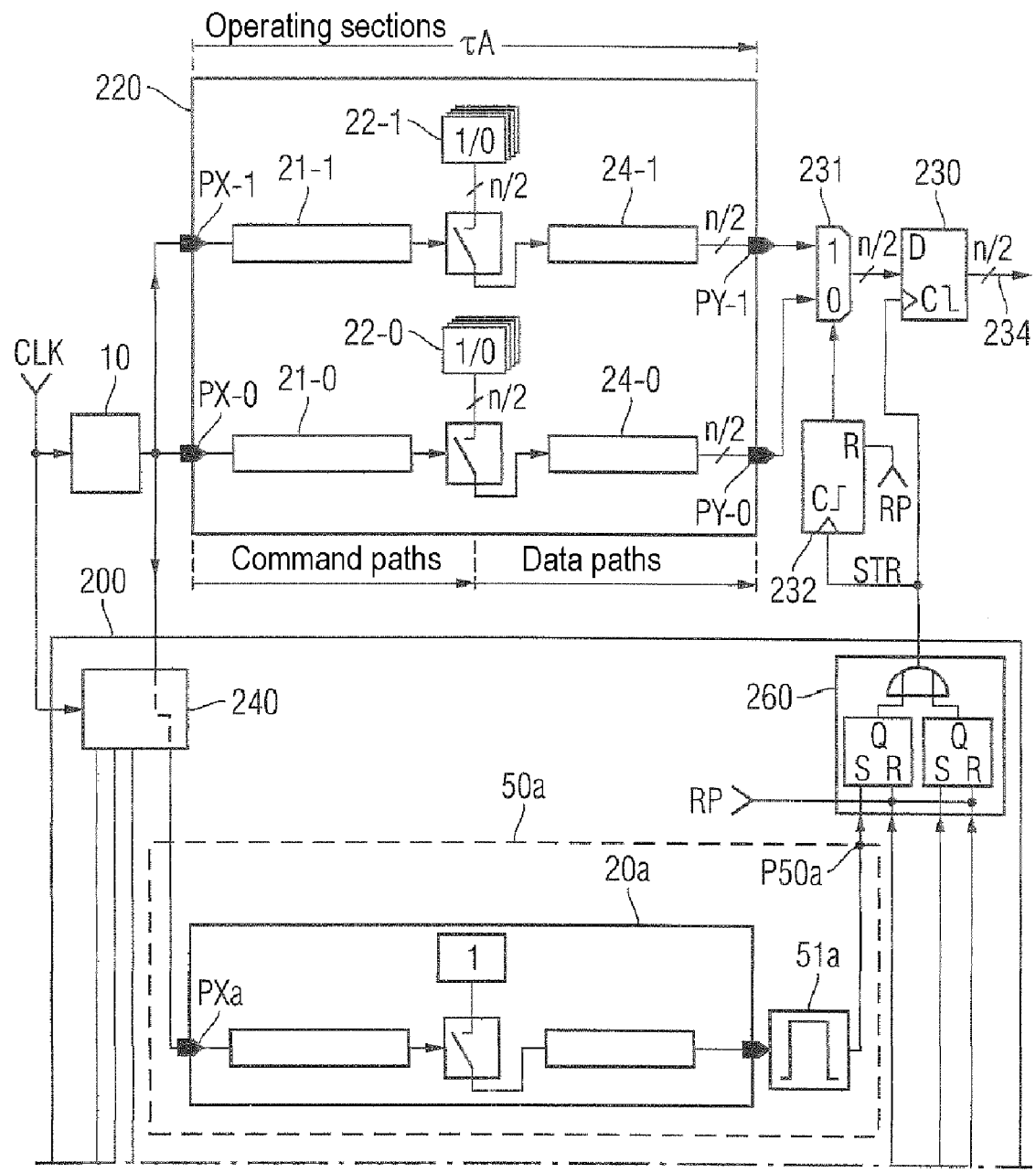
Figure 3B:
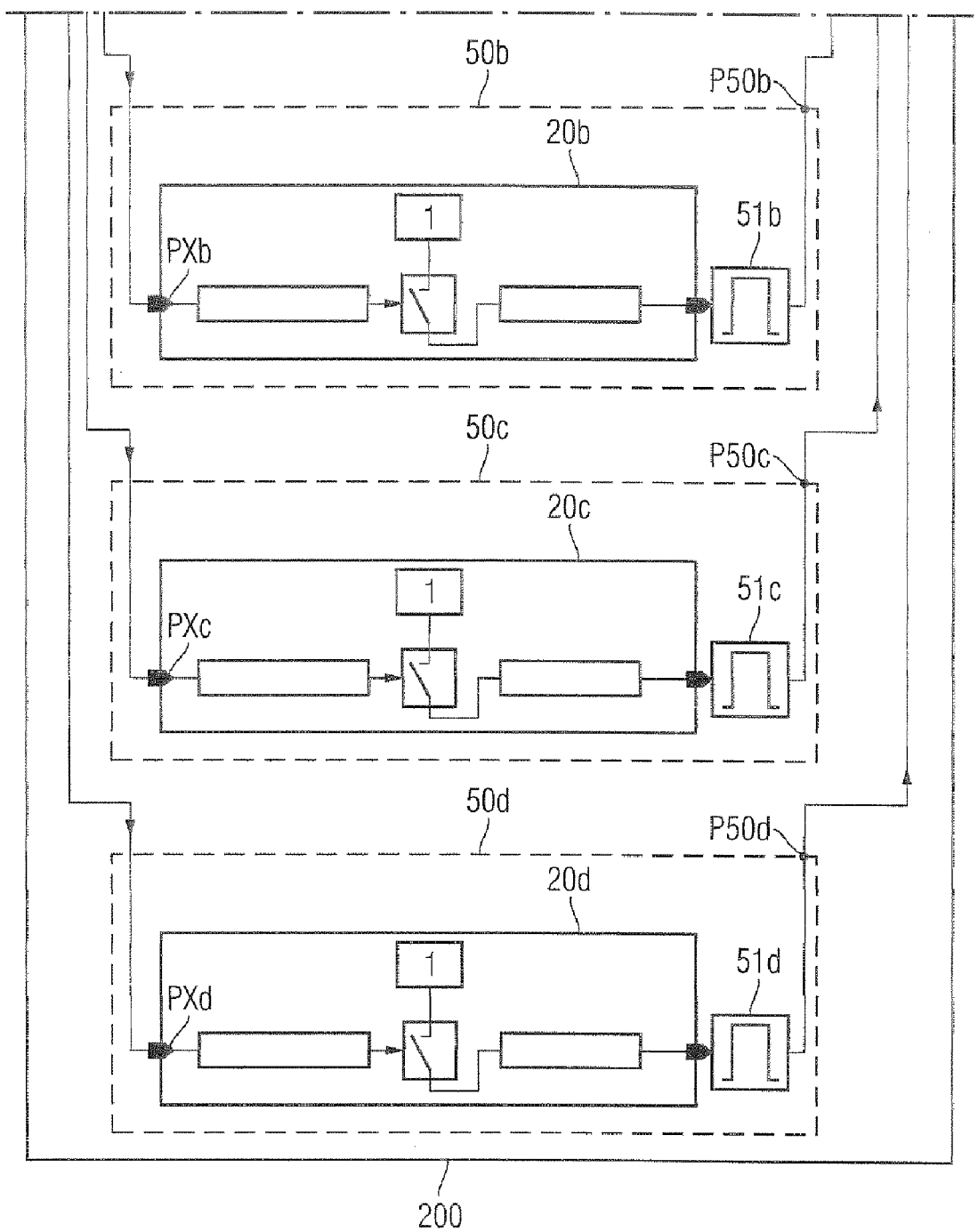

FIG. 3 shows an exemplary embodiment of a integrated circuit for k-fold sampling of this kind, specifically for the exemplary case of k=2. The top part of FIG. 3 schematically shows an arrangement of in total n operating sections, each of which corresponds to the operating section shown in FIG. 1, within a block 220. Each of these operating sections has an associated dedicated cell in an n-cell data source and an associated dedicated data path. The cells in the data source form k=2 groups 22-0 and 22-1 of n/k=n/2 respective elements which are all simultaneously connected to associated connection groups PY-0 and PY-1 from the data output by means of associate transfer switch groups and data path groups 24-0 and 24-1 when a request command arrives from the command issuer 10.

It will be assumed that the cells in the data source respectively contain new data prior to each request, either as a result of fresh loading or as a result of their respectively being reselected from a larger set of available cells. In addition, it will be assumed that each cell group 22-0, 22-1 has an associated dedicated command path 21-0 or 21-1, these command paths resembling one another and hence also having the same delay time. Accordingly, FIG. 3 shows two command inputs PX-0 and PX-1 which receive the request commands from the command issuer 10 at the same time. Alternatively, just a single common command path may be provided whose end branches to the two switch groups.

The two groups PY-1 and PY-2 of connections from the data output are connected to two associated n/2-bit inputs of a multiplexer 231 whose n/2-bit output is connected to the n/2-bit data input D of a sampling circuit 230. The bottom part of FIG. 3 shows the control section 200 which produces the control edges for the multiplexer 231 and for the sampling circuit 230.

Figure 4:
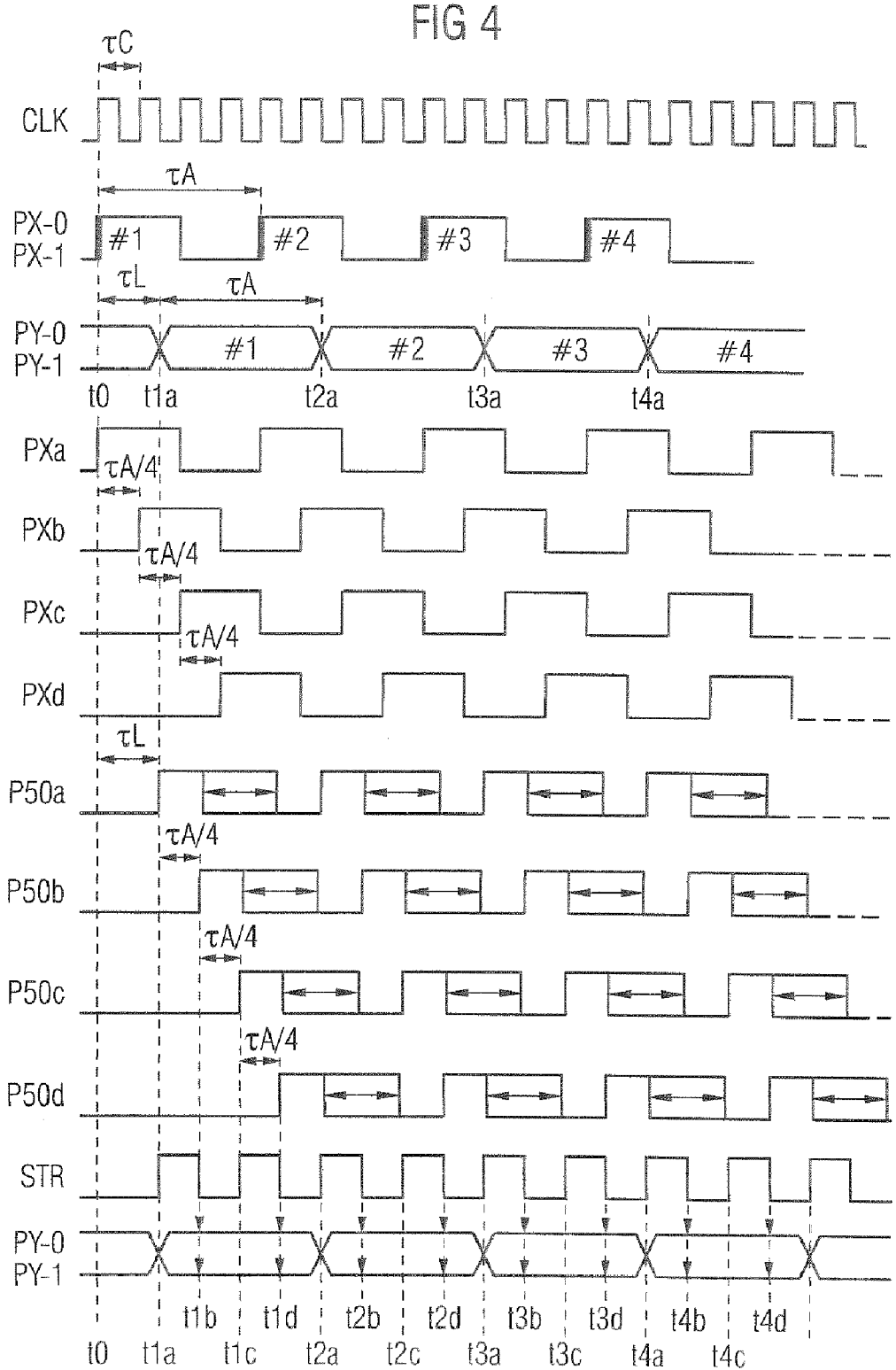
FIG. 4 shows the timing of signal states at various points of the integrated circuit shown in FIG. 3.

FIG. 4 shows, in a similar illustration to that in FIG. 2, the potential waveforms which appear at various points of the integrated circuit shown in FIG. 3 when a sequence of request commands is applied to the command inputs PX-0 and PX-1. The first three lines in FIG. 4 correspond to the first three lines in FIG. 3 and show the clock signal CLK, the sequence of request commands supplied by the command issuer 10 to the command inputs PX-0 and PX-1 of the operating sections 220 shown in FIG. 3 and the periods of the data bits, in the manner in which they appear in sync on the connection groups PY-0 and PY-1 from the data output.

The control section 200 shown in FIG. 3 contains 2k=4 transmission branches 50a:d, each of which is designed like each of the branches 50a, b in the control section 100 shown in FIG. 1. An input circuit 240 supplies four pulse trains, the first of which corresponds to the sequence of request pulses and is applied to the input PXa of the first branch 50a, as in the embodiment shown in FIG. 1. The other three pulse trains have the same waveform, they are delayed increasingly over the first sequence in increments of $\tau A/2k=\tau A/4$, respectively, and are applied to the inputs PXb, PXc, PXd of the other three branches 50b, 50c, 50d. Hence, the outputs P50a:d of the four branches 50a:d produce four output pulse trains which are delayed by $\tau A/4$ relative to one another.

The leading edges of the first output pulse train appear at the times t1a, t2a, t3a, t4a, that is to say with a delay corresponding to the latency $\tau L$ after the request commands; they therefore mark the starts of the data bits at the data output. These edges can be used to switch the multiplexer 231 to its first state, e.g. the "0" state, in which it connects the connection group PY-0 to the data input of the sampling circuit 230.

The leading edges of the second output pulse train appear at times t1b, t2b, t3b, t4b, which are delayed over the data starts by $\tau A/4$. These edges can be used to operate the sampling circuit 230, so that the bits from the connection group PY-0 are put onto an n/2-bit output bus 234.

The leading edges of the third output pulse train appear after a further delay time $\tau A/4$, that is to say at times t1c, t2c, t3c, t4c. These edges can be used to change over the multiplexer 231 to its second state, that is say the "1" state, in which it connects the connection group PY-1 to the data input of the sampling circuit 230.

The leading edges of the fourth output pulse train appear after an additional delay time $\tau/4$, that is to say at time t1d, t2d, t3d, t4d. The edges can be used to operate the sampling circuit 230 in turn, so that the bits from the connection group PY-1 are put onto the output bus 234.

In the manner described above, it is thus possible to sample requested n-bit data packets such that they are forwarded in successive n/2-bit subpackets at double repetition rate. The relevant switching and sampling edges can, if desired, be packed together in a single strobe signal STR. To this end, an output circuit, which is shown as block 260 in FIG. 3, may be provided on the control section 200, which receives all the pulse trains from the transmission branches 50a:d and changes the binary level on its output connection each time a leading edge (a rising edge in the case shown) appears in any of the pulse trains. By way of example, the output circuit 260 may contain two RS flipflops and a downstream OR gate, as shown in FIG. 3. Before the start of operation, these flipflops are reset by an initialization pulse RP on their R inputs.

The strobe signal STR formed in a manner described above is a square wave with alternate rising and falling edges. Before the start of the operation, the output circuit 260 is put, by an initialization pulse RP, into a state in which it supplies a preselected binary level, e.g. "0", so that the first edge is in a preselected direction, that is to say "rising". In this case, the rising edges of the strobe signal can be used to change over the multiplexer 231, and the falling edges can be used to operate the sampling circuit 230. Accordingly, the sampling circuit 230 shown in FIG. 3, receiving the strobe signal STR, is designed such that it responds to falling edges. To control the multiplexer 231, a bistable circuit 232 is provided which is set to "0" by the initialization pulse RP and can be changed over upon each rising edge of the strobe signal STR.

The 2-to-1 multiplexing described is just one example. Generally, k-to-1 multiplexing requires the provision of a plurality 2k of transmission branches in the control section which are similar to the branches 50a:d shown in FIG. 3 and whose input pulse trains are delayed by $\tau/2k$ relative to one another. The strobe signal then contains 2k edges for each bit period, with the k edges with an uneven ordinal number being used for cyclically changing over the multiplexer and the k edges with an even ordinal number being used for the sampling.

The need to request a sequence of data packets which respectively contain a plurality of parallel bits and to sample it at a data output taking account of the latency arises, by way of example, in the read mode of a memory chip. In this case, it can be applied either with or without multiplexing. The text below gives a more detailed description of an embodiment for a memory with reference to FIG. 5, specifically for the read mode on banks in a DRAM chip.

A memory bank in DRAM chip is known to contain a multiplicity of memory cells which are arranged in matrix form in rows and columns and each of which can store a data bit. Read or write access is usually effected on a respective plurality of memory cells at the same time, so that a packet comprising a plurality of data bits is read or written in parallel form. The memory cells are selected by a row address, which connects all the cells in the addressed row to a respective local amplifier (frequently also referred to as a "sense amplifier") in which the relevant memory bit is latched, so that it is available for retrieval at the amplifier output. A column address then selects four "column selection switches" which are closed in response to a read command in order to connect four associated instances of the local amplifiers to an output connection of the memory bank by means of a respective data path.

Normally, the bank's memory matrix is divided into a plurality q of segments of equal size, each of which has associated dedicated local amplifiers. The row address addresses a respective row in each segment at the same time, so that, in response to a request command, 4*q respective data bits are transmitted in parallel form from 4*q local amplifiers via associated data paths to 4*q output connections, where they can then be sampled. In line with the terminology used further above, the set of local amplifiers forms the "data source" at which the data bits are requested by closing the selected switches. The plurality of n output connections forms the "data output".

Figure 5B:
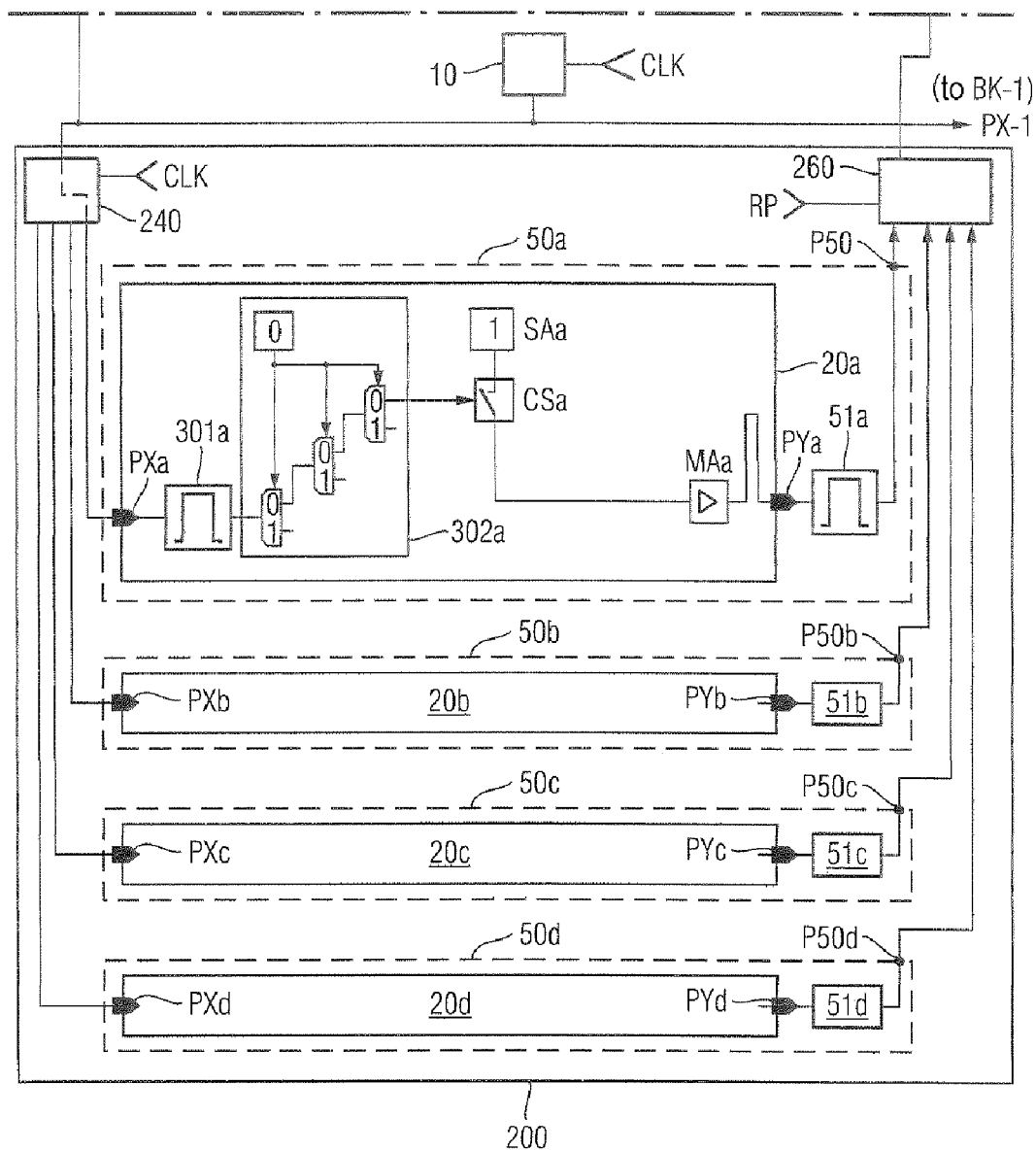
FIG. 5 shows further details of an inventive device in a particular embodiment for requesting and sampling data on a memory bank in a DRAM chip.

The top part of FIG. 5 shows, in schematic and fragmentary form, the design of a memory bank BK-0 in a DRAM chip which also contains three further banks BK-1, BK-2, BK-3, which are all of the same design and work in the same manner, as described below for the bank BK-0. The matrix of memory cells is not shown; what are shown are just the local amplifiers SA and the associated transfer switches CS, specifically the two segments SG of the matrix. The total number q of segments SG is usually greater than 2. For the example described here, it is assumed that q=8.

Four respective local amplifiers SA form a group, as is the case for the associated transfer switches CS. Each segment SG contains a plurality p of such groups, corresponding to the number of column quadruples in the segment. For the purpose of explanation, FIG. 5 shows the exemplary case in which p=8 such quadruples per segment are provided. For reasons of clarity, FIG. 5 respectively shows only the first and the last two quadruples, the remaining quadruples being indicated merely as dots. In practice, the number of quadruples per segment is usually much greater than 8 (e.g. $2^8$ or an even higher power of 2). In each segment SG, each quadruple of the transfer switches SC, when the relevant switches are closed, connects the associated quadruple of the local amplifiers SA to a quadruple of master amplifiers MA via a data line network, the outputs of said master amplifiers being via a 4-bit data line from the bank to a data output PY. If the bank, as assumed as an example, contains q=8 segments, the eight 4-bit data lines of the segments produce a 32-bit bank databus BB, and the data output PY contains 32 parallel connections.

Before a read access operation, the bank is "activated", as a result of which each local amplifier SA latches a respective data bit "0" or "1", that is to say provides a binary level which corresponds to the data bit from a memory cell selected by the row address within the associated column. To request successive packets of 4*q=32 respective parallel data bits (4 respective bits from each segment SG), a command issuer 10 supplies a sequence of request commands to a command connection PX-0 for the bank BK-0. The command issuer corresponds to the command issuer 10 shown in FIG. 1 and FIG. 3 and supplies the request commands under synchronization by a clock signal CLK.

In response to each command, a selection pulse shaper 301 produces a selection pulse of defined duration which is passed to the signal input of a column decoder 302. In the case shown, the decoder 302 is a 1-of-8 decoder, comprising a tree circuit containing 1-of-2 demultiplexers which can be conditioned by a 3-bit column address ADR such that it transmits the selection pulse to a selected instance of eight output connections. Each of these connections is connected to an individually associated selection line from a total of eight selection lines 303. Each of these lines 303 is routed to the control connections of an individually associated quadruple of the transfer switches CS in each segment SG of the bank.

For each request command, a column address ADR is applied to the decoder 302, so that the selection pulse produced with this command closes the transfer switches CS for a selected quadruple of the local amplifiers SA in each of the eight segments SG. In this manner, each command which is applied to the command connection PX prompts a 32-bit data packet from the set of local amplifiers SA to be requested which appears at the data output PY-0 of the bank BK-0 after a latency τL. The time relationship between the sequence of request pulses on the command connection PY-0 and the development of the data bits at the data output PY-0 corresponds to the illustration in the second and third lines of the timing diagram in FIG. 2 and FIG. 4.

The 32-bit data packet appearing at the output PY-0 can either be sampled directly over its full width or can be sampled using time-division multiplexing with the sampling operation at the data output PY-1 on a second bank BK-1, which is operated in sync with the bank BK-1 and likewise receives the request commands from the command issuer 10, as indicated in FIG. 5. For simple sampling without multiplexing, the control section 100 shown in FIG. 1 can be used. For sampling using the 2-to-1 multiplex, the control section 200 shown in FIG. 3 can be used.

The bottom part of FIG. 5 shows the control section 200 for deriving a strobe signal STR for multiplexed sampling using the same reference numerals as in FIG. 3, but with the elements within the operating section copies 20a:d being shown in more detail in order to illustrate their special design for the read mode on the memory bank BK-0, which was described above.

Each original operating section, which in the memory band BK-0 is routed from the command input PX-0 to the data output PY-0, contains the following subsections for each requested data bit: the command line from the command connection PX-0 to the selection pulse shaper 301; the pulse shaper 301 itself; the signal path set up in the column decoder 302 from the pulse shaper 301 to one of the column selection lines 303; the length of the relevant selection line from the decoder output to the control connection of a transfer switch CS; the data path running via the switch from the associated local amplifier SA to a master amplifier MA; the master amplifier itself; the data line from the master amplifier to the data output PY-0. The chain of all of these subsections for a data bit is modelled in each operating section copy 20a:d, with modelling of the signal path set up via the decoder 302 requiring only the provision of a cascade of 1d=3 demultiplexers which are all set (e.g. by a fixed control bit "0") such that they transmit the selection pulse from the input of the cascade to its output, as shown in FIG. 5.

As in the general basic illustration shown in FIG. 1, the data sources in the operating section copies 50a:d, which in this case are respectively modelled by a copy of a local amplifier SA, are set to data bit having a fixed binary value "1" in the example shown in FIG. 5 too. Hence, the signals at the outputs P50:*d* of the four branches 50*a*:*d* in the control section 200 and the strobe signal STR correspond to the waveforms shown in FIG. 4.

FIG. 5 does not show the second bank BK-1, whose read data are supposed to be multiplexed with the read data from the bank BK-1 32, in detail. It shows only its data output PY-1. The multiplexing sampling circuit used in FIG. 5 corresponds to that from FIG. 3. It contains the 2-to-1 multiplexer 231, the multiplexer control circuit 232 and the sampling circuit 230, which work in exactly the same way as has been described in connection with FIG. 3. Hence, each total packet of n=64 bits, which appear simultaneously at the data output PY-0 and PY-1 of the two banks BK-0 and BK-1, is split into successive 32-bit data packets.

In one embodiment, not only the circuitry but also the physical nature of the operating section copies 50*a*:*d* are designed and arranged such that the layout of said copies is the same as the layout of one of the original operating sections and that the local course of said copies is also close to the local course of the relevant original operating section. In the case of a memory bank in an integrated memory chip, it is therefore to integrate the elements of each operating section copy along the elements of an original operating section, so that the command path of the copy runs physically next to an original command path, and the data path of the copy runs next to an original data path. Hence, parts of the operating section copies form parts of the memory bank layout. If an integrated memory chip contains two memory banks, it is for just two respective operating section copies to be integrated on or in each bank. If there are four memory banks, it is to integrate just one operating section copy in each bank. This has the advantage that the layout is the same for all banks.

Figure 6:
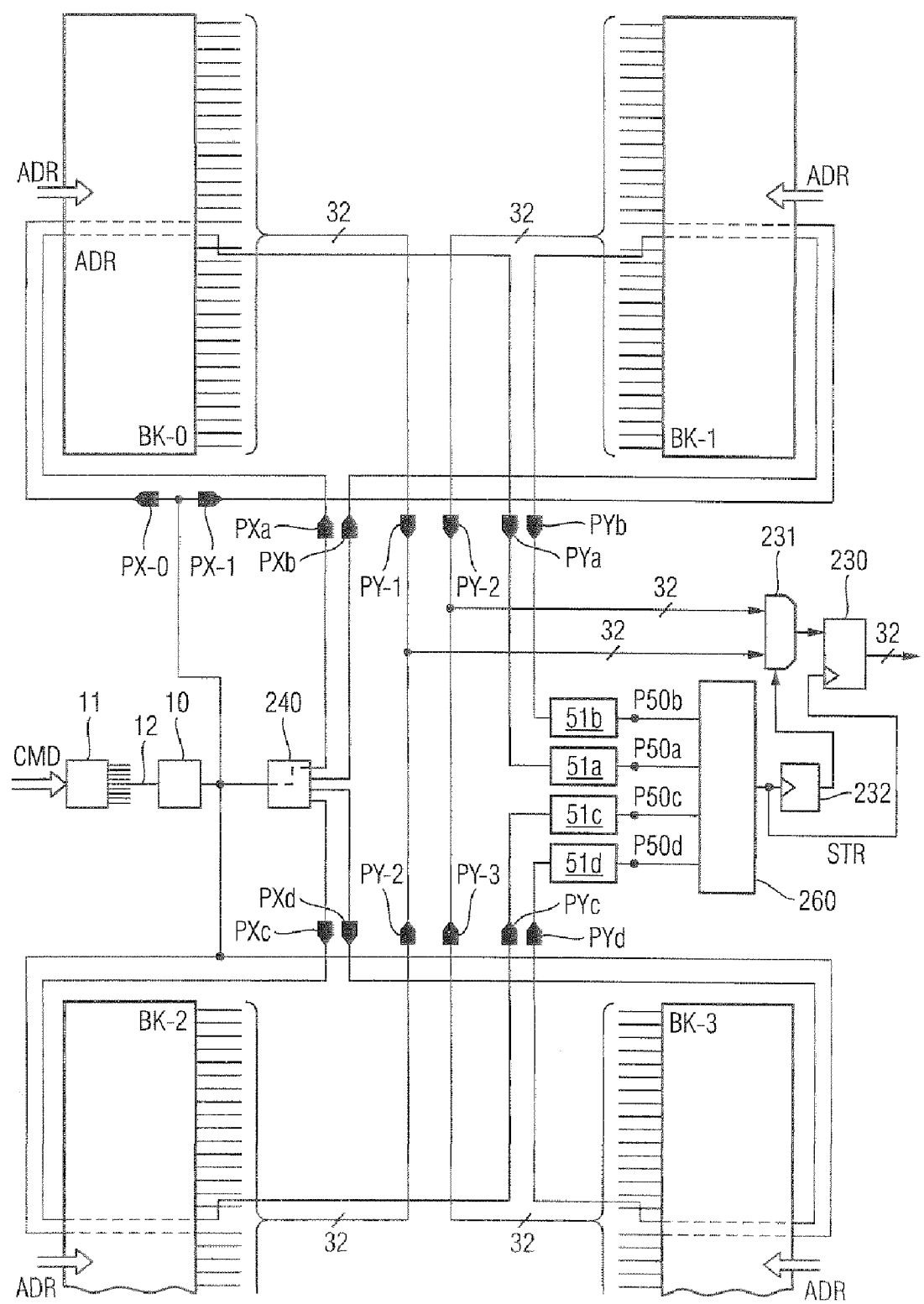
FIG. 6 illustrates the application in a DRAM chip which contains a plurality of memory banks.

FIG. 6 shows an example of the integration of an inventive device in connection with four banks BK-0, BK-1, BK-2, BK-3 of a DRAM chip which are integrated in the usual manner in four quadrants of the surface area of a semiconductor chip. Each of the four banks BK-0:3 is of similar design to the memory bank BK-1 shown in FIG. 5 and can be operated in the manner described above in order to request a sequence of 32 respective parallel data bits from 32 respective selected local amplifiers. The interspaces between the four banks BK-0:3 contain the lines to and from the banks and also various additional circuit elements, including, inter alia, a few components of an inventive device for sampling the read data requested from the banks. These components, in so far as they concern multiplexed sampling on the two banks BK-0 and BK-1 (or on the two banks BK-2 and BK-3), are denoted by the same reference symbols in FIG. 6 as in FIG. 5.

The command issuer 10 shown in FIG. 6 may be a device which responds to the output signal from a command decoder 11, which receives command code words CMD from an external controller in order to supply a sequence of request commands, as is shown in the second line of FIG. 4, in the case of read commands. To this end, the command issuer 10 may contain a "burst counter" which, in response to a respective single read command, produces a predetermined number of request commands at the time interval $\tau A$ in order to request a burst of an appropriate number of successive 64-bit data packets from the bank pair BK-0:1 or BK-2:3.

Each operating section for requesting a data packet from a bank extends from this bank's associated command connection PX-0 or PX-1 or PX-2 or PX-3, which is connected directly to the output of the command issuer 10, via a connecting line to an associated input of the bank and from there through the bank to the data output PY-0 or PX-1 or PX-2 or PX-3 of the bank. The part of an operating section which runs inside the bank (cf. the elements within the bank BK-0 in FIG. 5) is shown in dashes, specifically for an operating section of average length which passes via an output line in the central region of the bank.

As shown in the illustration in FIG. 6, the first operating section copy extends from the connection PXa, which is connected to the first output of the control section input circuit 240, via a connecting line to an associated input of the bank BK-0 and from there through this bank to the output connection PYa. The part of this copy which runs inside the bank BK-0 is likewise shown in dashes. The second operating section copy extends from the connection PXb, which is connected to the second output of the control section input circuit 240, via a connecting line to an associated input of the band BK-1 and from there through this bank to the output connection PYb. The third operating section copy extends from the connection PXc, which is connected to the third output of the control section input circuit 240, via a connecting line to an associated input of the bank BK-2 and from there through this bank to the output connection PYc. The fourth operating section copy extends from the connection PXd, which is connected to the fourth output of the control section input circuit 240, via a connecting line to an associated input of the bank BK-3 and from there through this bank to the output connection PYc.

As shown in detail in FIG. 5 (and also described with reference to FIG. 3), the outputs PYa:d of all the operating section copies are logically combined by means of the respective associated pulse shaper 51*a*:*d* in the output circuit 260 in order to produce the strobe signal STR.

The two banks BK-0 and BK-1 are "paired" in order to sample the data packets appearing at their data outputs PY-0 and PY-1 in the multiplex by means of the multiplexer 231 using the sampling circuit 230, as has been described with reference to FIG. 5. That is to say that the data outputs of these two banks are connected to the inputs of the multiplexer 231. The sampling circuit 230 may be an FIFO register which is clocked by the falling edges of the strobe signal STR.

The other two banks BK-2:3 are paired in exactly the same manner as described above for the bank pair BK-0:1. The data outputs PY-2:3 may likewise be connected to the inputs of the multiplexer 231 if the memory chip is operated such that only one of the bank pairs is ever addressed. If the aim is to organize a mode in which all the banks are addressed simultaneously then two separate multiplexers need to be provided, a respective one for each bank pair, and a dedicated sampling circuit downstream of each multiplexer. These separate circuits can then be controlled using the same strobe signal.

In the description above, it has been assumed that the delaying action of the lines and elements between the output of the command issuer 10, on the one hand, and the inputs of the control section branches and the inputs of the operating sections, on the other hand, is of the same magnitude in each case or is only negligibly small in comparison with the latency of the operating sections. The same also applies to the delaying action of the line and elements between the outputs of the control section branches and the control connection of the sampling circuit. If any delay differences are not negligible, they can be compensated for by suitable means, e.g. by inserting additional compensating delays.

In conclusion, it should be noted that the embodiments are not limited to data requesting on memory chips. It can be applied advantageously wherever individual data bits or data packets need to be sampled which are requested in succession from a data source and appear at a data output after a latency.

The preceding description describes exemplary embodiments. The features disclosed therein and the claims and the drawings can, therefore, be useful for realizing various embodiments, both individually and in any combination. While the foregoing is directed to specific embodiments, other and further embodiments may be devised without departing from the basic scope, the scope being determined by the claims that follow.

What is claimed is:

1. An integrated circuit, comprising:
   a sampling circuit arranged at a data output of an operating section and operated by sampling edges, wherein data packets appear at the data output in response to a sequence of request commands; and
   a control section configured to produce the sampling edges, the control section comprising at least two transmission branches each comprising a copy of the operating section,
   wherein pulse trains are applied to the transmission branches which have the same waveform as the sequence of request commands and are delayed relative to one another, wherein the first pulse train is contemporaneous with the sequence of request commands, and
   wherein the sampling edges are produced from leading edges of the pulse trains which appear at the outputs of the transmission branches.

2. The integrated circuit as claimed in claim 1, wherein the control section comprises a time circuit which inverts the responses appearing at the outputs of the transmission branches after a time interval which is shorter than a time interval of the request commands.

3. The integrated circuit as claimed in claim 1, wherein a strobe signal for the data sampling is produced from the sampling edges.

4. The integrated circuit as claimed in claim 3, wherein those edges of the strobe signal which are in the same direction as a first level change form the leading edges of strobe pulses and the edges in the opposite direction form the trailing edges of the strobe pulses,
   wherein the sampling circuit is operated only by the trailing edges of the strobe pulses.

5. The integrated circuit as claimed in claim 4, wherein an output of the sampling circuit is connected to an input of a demultiplexer which is changed over cyclically by the leading edges of the strobe signal.

6. A memory comprising a plurality of memory banks with a respective multiplicity of memory cells, wherein a command issuer supplies request commands for reading data packets from memory cells which are selected before each request command by an address information item, each memory bank comprising:
   a sampling circuit arranged at a data output of an operating section and operated by sampling edges, wherein data packets appear at the data output in response to a sequence of request commands, and
   a control section configured to produce the sampling edges, the control section comprising at least two transmission branches each comprising a copy of the operating section,
   wherein pulse trains are applied to the transmission branches which have the same waveform as the sequence of request commands and are delayed relative to one another, wherein the first pulse train is contemporaneous with the sequence of request commands, and
   wherein the sampling edges are produced from leading edges of the pulse trains which appear at the outputs of the transmission branches.

7. The memory as claimed in claim 6, wherein the control section comprises a time circuit which inverts the responses appearing at the outputs of the transmission branches after a time interval which is shorter than a time interval of the request commands.

8. The memory as claimed in claim 6, wherein a strobe signal for the data sampling is produced from the sampling edges.

9. The memory as claimed in claim 8, wherein those edges of the strobe signal which are in the same direction as a first level change form the leading edges of strobe pulses and the edges in the opposite direction form the trailing edges of the strobe pulses,
   wherein the sampling circuit is operated only by the trailing edges of the strobe pulses.

10. An integrated circuit with a sequence of data packets which respectively comprise $n \geq 1$ parallel data bits at a data output, where each of the data packets respectively appears in response to a request command which is sent by a command issuer to a source of the relevant data packet,
    the integrated circuit comprising:
    a sampling circuit which is arranged at the data output and which is operated by edges in the same respective direction as a strobe signal changing between two levels,
    and a control section which produces the strobe signal,
    the control section comprising:
    an input circuit configured to produce an even plurality 2k of input pulse trains which have the same waveform as a sequence of request commands and are delayed relative to one another by the measure $\tau A/2k$, where k is an integer greater than 0, where $\tau A$ is a time interval of the request commands, and where the first input pulse train is contemporaneous with the sequence of request commands,
    a plurality 2k of transmission branches which are connected to receive the 2k input pulse trains and each of which comprises a copy of an operating section, the operating section extending from the command issuer to the data output,
    a time circuit which inverts the responses appearing at the outputs of the transmission branches after a time interval which is shorter than $\tau A$;
    an output circuit which is connected to receive the output pulse trains from the time circuit and, whenever a leading edge appears in these pulse trains, changes the level of the strobe signal.

11. The integrated circuit as claimed in claim 10, wherein those edges of the strobe signal which are in the same direction as the first level change form the leading edges of strobe pulses and the edges in the opposite direction form the trailing edges of the strobe pulses,
    wherein the sampling circuit is operated only by the trailing edges of the strobe pulses.

12. The integrated circuit as claimed in claim 10, wherein $\tau A$ is an integer multiple $z*k$ of the repetition period $\tau C$ for edges of a clock signal,
    wherein the command issuer and the input circuit are connected for the purpose of receiving the clock signal,
    wherein the command issuer produces the request commands in sync with selected clock edges, and
    wherein the input circuit produces the first input pulse train likewise in sync with the selected clock edges and the produces the further input pulse trains in sync with clock edges which appear later than the selected clock edges by increments of z respective repetition periods $\tau C$.

13. The integrated circuit as claimed in claim 11, wherein an output of the sampling circuit is connected to an input of a demultiplexer which is changed over cyclically by the leading edges of the strobe signal.

14. The integrated circuit as claimed in claim 11, wherein each data packet comprises k disjunct groups of n/k respective parallel data bits which appear on k associated disjunct groups of n/k respective connections of the data output,
   wherein the sampling circuit is configured to sample a group of n/k parallel data bits and can be operated by trailing edges of the strobe signal, and
   wherein the k connection groups of the data output are connected to k associated n/k-bit inputs of a k-to-1 multiplexer which can be changed over cyclically by the leading edges of the strobe signal and whose n/k-bit output is connected to the n/k-bit input of the sampling circuit.

15. The integrated circuit as claimed in claim 10, comprising a plurality of memory banks with a respective multiplicity of memory cells,
   wherein the command issuer supplies the request commands for reading data packets from n memory cells which are selected before each request command by an address information item, and
   wherein the operating section copies are integrated in the banks in the same layout as the original operating sections.

16. The integrated circuit as claimed in claim 15, wherein each memory bank integrates the same number of operating section copies in the same layout.

17. The integrated circuit as claimed in claim 14, comprising a plurality of memory banks with the respective multiplicity of memory cells,
   wherein the command issuer supplies the request commands for reading data packets from n memory cells which are selected before each request command by an address information item, and
   wherein the k disjunct connection groups are connections at the data outputs k of various memory banks.

18. A memory having a multiplicity of selectively addressable memory cells and having a sampling device for sampling data packets which are transmitted upon request from selected memory cells to a data output,
   the sampling device comprising:
   a sampling circuit which is arranged at the data output and which is operated by edges in the same respective direction as a strobe signal changing between two levels,
   and a control section which produces the strobe signal,
   the control section comprising:
   an input circuit configured to produce an even plurality 2k of input pulse trains which have the same waveform as a sequence of request commands and are delayed relative to one another by the measure $\tau A/2k$, where k is an integer greater than 0, where $\tau A$ is a time interval of the request commands, and where the first input pulse train is contemporaneous with the sequence of request commands,
   a plurality 2k of transmission branches which are connected to receive the 2k input pulse trains and each of which comprises a copy of the operating section extending from a command issuer to the data output,
   a time circuit which inverts the responses appearing at the outputs of the transmission branches after a time interval which is shorter than $\tau A$;
   an output circuit which is connected to receive the output pulse trains from the time circuit and, whenever a leading edge appears in these pulse trains, changes the level of the strobe signal.

19. The memory as claimed in claim 18, wherein those edges of the strobe signal which are in the same direction as the first level change form the leading edges of strobe pulses and the edges in the opposite direction form the trailing edges of the strobe pulses,
   wherein the sampling circuit is operated only by the trailing edges of the strobe pulses.

20. The memory as claimed in claim 18, wherein $\tau A$ is an integer multiple $z*k$ of the repetition period $\tau C$ for edges of a clock signal,
   wherein the command issuer and the input circuit are connected for the purpose of receiving the clock signal,
   wherein the command issuer produces the request commands in sync with selected clock edges, and
   wherein the input circuit produces the first input pulse train likewise in sync with the selected clock edges and the produces the further input pulse trains in sync with clock edges which appear later than the selected clock edges by increments of z respective repetition periods $\tau C$.

21. The memory as claimed in claim 19, wherein an output of the sampling circuit is connected to an input of a demultiplexer which is changed over cyclically by the leading edges of the strobe signal.

22. The memory as claimed in claim 19, wherein each data packet comprises k disjunct groups of n/k respective parallel data bits which appear on k associated disjunct groups of n/k respective connections of the data output,
   wherein the sampling circuit is configured to sample a group of n/k parallel data bits and can be operated by trailing edges of the strobe signal, and
   wherein the k connection groups of the data output are connected to k associated n/k-bit inputs of a k-to-1 multiplexer which can be changed over cyclically by the leading edges of the strobe signal and whose n/k-bit output is connected to the n/k-bit input of the sampling circuit.

23. The memory as claimed in claim 18, comprising a plurality of memory banks with a respective multiplicity of memory cells, where the command issuer supplies the request commands for reading data packets from n memory cells which are selected before each request command by an address information item,
   wherein the operating section copies are integrated in the banks in the same layout as the original operating sections.

24. The memory as claimed in claim 23, wherein each memory bank integrates the same number of operating section copies in the same layout.

* * * * *